United States Patent [19]

Jerinic et al.

[11] Patent Number: 4,689,583
[45] Date of Patent: Aug. 25, 1987

[54] DUAL DIODE MODULE WITH HEAT SINK, FOR USE IN A CAVITY POWER COMBINER

[75] Inventors: George Jerinic, Acton; Robert Steele, Sudbury; James R. Fines, Tewksbury, all of Mass.

[73] Assignee: Raytheon Company, Lexington, Mass.

[21] Appl. No.: 579,732

[22] Filed: Feb. 13, 1984

[51] Int. Cl.$^4$ .................. H03B 27/00; H01L 23/12
[52] U.S. Cl. .................................... 331/56; 331/96; 331/107 P; 331/107 C; 357/81; 333/250
[58] Field of Search .................. 333/247, 250; 331/56, 331/96, 101, 107 DP, 107 P, 107 C; 330/56, 287; 357/81; 174/16 HS

[56] References Cited

U.S. PATENT DOCUMENTS

| | | | |
|---|---|---|---|
| 2,981,873 | 4/1961 | Eannarino et al. | 357/81 X |
| 3,452,305 | 6/1969 | Hefni | 333/250 X |
| 3,521,203 | 7/1970 | Sharpless | 333/250 |
| 3,628,171 | 12/1971 | Kurokawa | 331/56 |
| 3,668,551 | 6/1972 | Kondo | 331/107 DP X |
| 3,711,792 | 1/1973 | Kaneko | 331/96 |
| 3,893,193 | 7/1975 | Anazawa et al. | 333/247 |
| 3,974,518 | 8/1976 | Lewis, Jr. et al. | 357/80 X |
| 3,986,153 | 10/1976 | Kuno et al. | 331/96 X |
| 4,021,839 | 5/1977 | Denlinger | 357/81 X |
| 4,032,805 | 6/1977 | Harp et al. | 333/250 X |
| 4,196,444 | 4/1986 | Butner et al. | 357/81 |
| 4,303,935 | 12/1981 | Ragaly | 357/81 X |

FOREIGN PATENT DOCUMENTS

| | | | |
|---|---|---|---|
| 0047706 | 4/1980 | Japan | 331/107 DP |
| 0108757 | 6/1983 | Japan | 357/81 |

OTHER PUBLICATIONS

Russell, E. M., Thomson, I.; "Embedded Diamond Heat Sinks for Avalanche Diode"; *Proceeding of the IEEE*, Aug. 1972; pp. 1014–1015.
Magao, H and Katayama, S.; "Silicon IMPATT Diode Device Incorporating a Diamond Heat Sink"; *NEC Research & Development*; No. 35, Oct. 1974, pp. 67–76.
"Improved Performance of Silicon Avalanche Oscillators Mounted on Diamond Heat Sinks", C. B. Swan, Proceedings of the IEEE, Sep. 1967, pp. 1617–1618.

*Primary Examiner*—Eugene R. LaRoche
*Assistant Examiner*—Benny Lee
*Attorney, Agent, or Firm*—Denis G. Maloney; Richard M. Sharkansky

[57] ABSTRACT

A composite diode module is provided having an impedance matching member integrally formed within the module. The module includes a base member, a heat sink holder member having an aperture, a gold plated diamond heat sink which is disposed in the aforementioned aperture, and an encapsulant holder member having a second aperture. IMPATT diodes are disposed in dielectric spacers bonded to one end of the heat sink in alignment with the second aperture. A bias pin member is then bonded on the second end of the IMPATT and an encapsulant having selected electrical properties is provided in the second pair of apertures to secure the diode and to provide the diode module with a predetermined impedance characteristic. In a preferred embodiment, the module includes a pair of IMPATT diodes. With this arrangement, the module may be used in power combiners.

17 Claims, 5 Drawing Figures

DUAL DIODE MODULE WITH HEAT SINK, FOR USE IN A CAVITY POWER COMBINER

BACKGROUND OF THE INVENTION

This invention relates generally to microwave circuits and more particularly to packaging of negative resistance diodes.

As is known in the art, a negative resistance diode, such as an IMPATT diode, is often employed in an oscillator or an amplifier to convert DC power to radio frequency power. IMPATT diodes are often employed in radio frequency applications where very high output radio frequency power at a very high frequency and relatively high conversion efficiency is required. As is well-known in the art, a plurality of radio frequency signals provided from a like plurality of IMPATT diode sources arranged in an appropriate manner may be combined into a composite signal by being coupled to a common resonant cavity. A portion of the composite signal is then coupled from the cavity to provide the output signal. In a conventional power combiner, each diode is mounted in a coaxial line amplifier or oscillator structure and a plurality of these coaxial structures are then coupled to sidewall portions of the resonant cavity. These coaxial structures are generally one of the more difficult elements to fabricate in the power combiner.

The coaxial line element generally includes an outer conductor dielectrically spaced from a centrally disposed inner conductor which provides in combination a coaxial transmission line. Typically, a tapered sleeve comprising a lossy plastic material is disposed around one end portion of the center conductor to provide a matched termination load for the transmission line. The opposing end portion of the center conductor is attached to a first electrode of a packaged IMPATT diode. A second electrode of the packaged IMPATT diode is attached to the outer conductor by threading the packaged diode into a diode holder which is a threaded portion of the outer conductor of the coaxial line section. Prior to the packaged diode making contact with the center conductor of the coaxial transmission line, an annular member and spacer member are generally provided around the center conductor to provide a requisite impedance match between the IMPATT diode and the cavity and also to provide a predetermined distance between the diode and the midplane of the resonant cavity.

To obtain optimum performance from an IMPATT diode, the heat generated by the IMPATT diode must be efficiently removed from the IMPATT diode. Therefore, one package commonly used with such IMPATT diodes includes a thermally and electrically conductive pedestal support comprising a threaded stud portion at one end and an upper mounting plate at the other end. Often, a gold plated slab of diamond, which serves as a heat sink, is impressed into or bonded to the upper mounting plate. A ceramic hollow cylindrical shaped barrel is then bonded to the gold plated diamond and a beam-leaded diode chip is then disposed inside the barrel with the bottom of the diode being bonded to the gold plated diamond heat sink. The heat sink thus also forms one of the aforementioned electrodes of the device, and beam leads of the diode being bonded to upper portions of the gold plated ceramic barrel, forms the second one of the aforementioned electrodes of the device.

Several problems are generally associated with the above-described arrangement. The first problem involves providing the requisite impedance matching between the IMPATT diode chip and the resonant cavity. As is known in the art, the IMPATT diode chip is a relatively low impedance device. Therefore, matching the impedance of the IMPATT diode to the impedance of the cavity requires the use of the above-mentioned annular member which is disposed around the center conductor of the coaxial transmission line and acts as an impedance transformer. In using the annular member, the diode chip must be coaxially aligned within the center of such member. This in turn requires that the ceramic barrel be mounted in the package in coaxial alignment with the threaded stud and the cylindrical plate. This is generally a difficult task to perform, however, requiring precise machining of the respective components. Additionally, there is an electrical problem associated with this type of design since there must be sufficient electrical contact around the circumference of the annular member in the region where such member meets the shoulder of the diode package. This region is a very low impedance region, and small gaps in this region may cause r.f. leakage and changes in diode impedance which may significantly degrade device performance. Therefore, for good contact, both the contacting surface of the annular or transformer member and the surface of the package shoulder must be flat and smooth. Since the surface of the package shoulder is formed by the facial surface of the upper plate and the diamond heat sink, the thickness of the diamond heat sink must be substantially equal to the depth of the machined hole provided in the upper plate, otherwise, the diamond slab will be slightly recessed or will slightly protrude. Further, the force imparted to the diamond to press it into the machined hole must be uniform; otherwise, the diamond slab will be tilted. If the diamond is recessed or protrudes or if tilting occurs, it is generally difficult to provide good electrical contact between the diamond heat sink and the transformer members. Further, the edges of a protruding diamond heat sink may damage the corner of the transformer as the package is torqued into place and good mechanical and electrical contact between the members may not be provided.

A second problem associated with this type of design involves the thermal transfer efficiency required to remove heat generated by the diode. Since the package requires extensive machining during its manufacture, it must be made from copper alloys which are relatively hard, and therefore, have lower thermal conductivity than the diode holder portion of the outer conductor. Further, since the package is screwed into place to make electrical contact with the center conductor of the coaxial line, a gap is often introduced between the underside of the package shoulder and the diode holder. Heat must travel down the threaded stud portion and then across the threaded interface before being dissipated in the diode holder. Since the threads are under compression, there is thermal contact only over about one-half of the available area, thus reducing efficiency of thermal transfer.

Handling precautions are an additional problem associated with this type of design because of the relatively small dimensions and special materials used in the parts of the diode package. For example, the ceramic barrel is not protected mechanically after the package has been assembled and therefore may be easily disturbed or damaged. Further, during assembly of the coaxial element, the center conductor is insulated from the outer conductor by an annular member machined from a material generally known as Rexolite. This material has a low r.f. dielectric loss. However, this material is very brittle when machined into small parts, and thus the breakage rate of these parts is often high during assembly of the coaxial elements. Finally, the threads on the stud portion must generally be formed in a copper alloy material. This material does not provide machined threads which can generally withstand the high torque encountered in mating the diode package to the transformer member during manufacture of the coaxial section without distorting the threads. Often, electrically good diodes are lost when stripped threads on the package make the diode unusable.

SUMMARY OF THE INVENTION

In accordance with the present invention, a module is provided having a base portion; a heat sink holder having at least one aperture; at least one heat sink, preferably a gold plated diamond heat sink disposed within the aperture; at least one apertured dielectric fixture disposed on said heat sink; at least one diode mounted within the apertured dielectric fixture; an encapsulating material holder having disposed at least one aperture and having in said aperture the dielectric fixture and mounted diode; and, at least one bias pin disposed on the diode with an encapsulating means disposed within the aperture of the holder. The module is assembled by inserting the heat sink into the aperture in the heat sink holder, and bonding the heat sink holder to the base. The diode and dielectric fixtures are then mounted on the heat sink. The encapsulating holder is then bonded to the heat sink holder and the bias pin is inserted in the aperture in the encapsulating material holder. An encapsulating material is then provided in said aperture to secure the diode and bias pin in place and to provide a predetermined impedance characteristic to the IMPATT diodes for matching to a cavity resonator.

With such an arrangement, a sturdy module having at least one diode is provided. By providing the encapsulating material holder and encapsulating material, the annular members or impedance transformers generally associated with prior art designs are eliminated, and also the IMPATT diode is hermetically sealed. Further, the component parts being preferably stamped from sheets of material may be more easily assembled together as compared with the diode coaxial section structures. The use of a heat sink holder member having a precisely machined aperture which is exposed through both surfaces of the heat sink holder member permits relatively easy insertion of the heat sink into the member and reduces any tendency of the diode to tilt which often occurs in prior art structures. Also, with this arrangement, the ceramic fixture is protected after complete assembly of the module thereby reducing breakage problems sometimes associated with handling of packaged diodes. The module also reduces the many breakage and heat transfer problems associated with torquing the packaged diode into the coaxial line elements since the module, rather than the individual ones of such packaged diodes, are torqued into place.

BRIEF DESCRIPTION OF THE DRAWINGS

The foregoing features of this invention, as well as the invention itself, may be more fully understood from the following detailed description taken in conjunction with the accompanying drawings, in which.

DESCRIPTION OF THE PREFERRED EMBODIMENT

Figure 1:
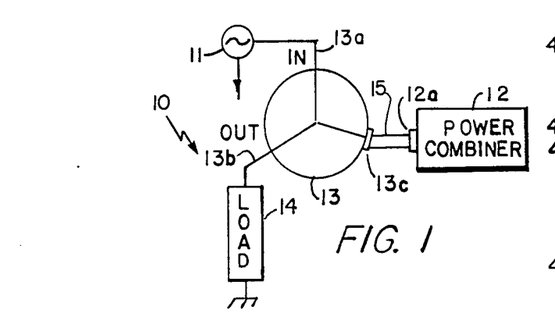
FIG. 1 is a block diagram of a stable amplifier including a power combiner circuit.

Referring now to FIG. 1, a stable amplifier 10 is shown to include a power combiner 12 having an input/output port 12a, and a circulator 13 having an input port 13a, an output port 13b, and a common port 13c. The common port 13c is connected to the input/output port 12a of power combiner 12, via a waveguide 15. The input port 13a is connected to a radio frequency (r.f.) signal source 11 which feeds r.f. energy into the circulator 13, such circulator 13 directing such fed signal to power combiner 12 via common port 13c. The output port 13b is connected to a load 14, and circulator 13 directs the amplified output signal from the power combiner 12 to such load 14 via output port 13b. The stable amplifier 10 provides an amplified radio frequency signal to the load 14 in response to an input or injection signal ($v_s$) provided by a signal source 11 and fed to the power combiner 12. The injected signal $v_s$ is used to shift the operating point of the power combiner along the IMPATT device line, and to produce in response thereto an amplified output radio frequency signal ($Gv_s$) at the input/output port 12a of power combiner 12 where G is the gain of the amplifier 10. Said amplified signal $Gv_s$ is fed to the circulator 13 and coupled to the output port 13b of the circulator 13 and hence to the load 14.

Figures 2, 3:
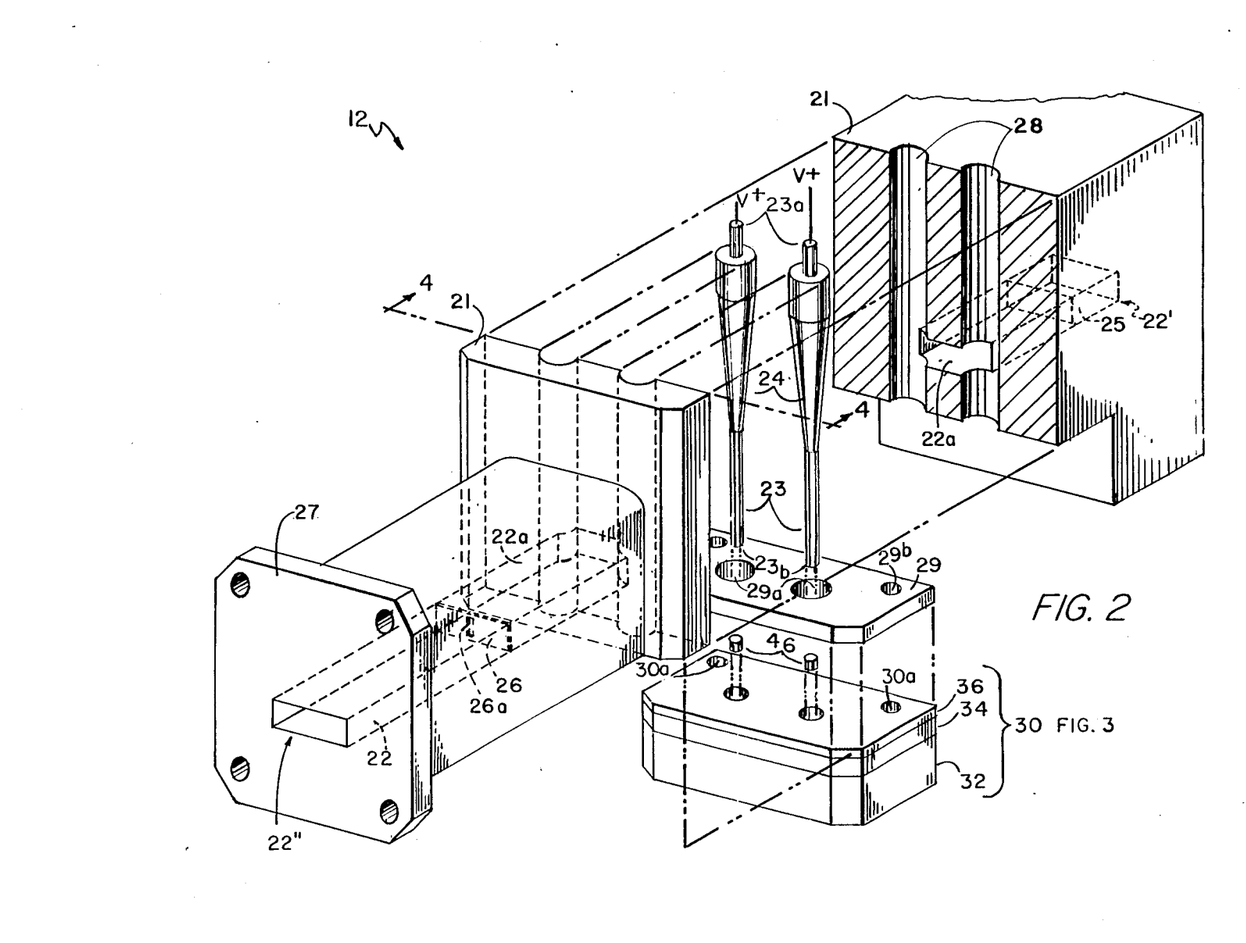
FIG. 2 is an exploded composite isometric view partially broken away of a power combiner circuit of the type employed in the stable amplifier of FIG. 1.
FIG. 3 is an exploded composite isometric view of a dual diode module in accordance with the present invention which is used in the power combiner circuit shown in FIG. 2.
Figure 3:
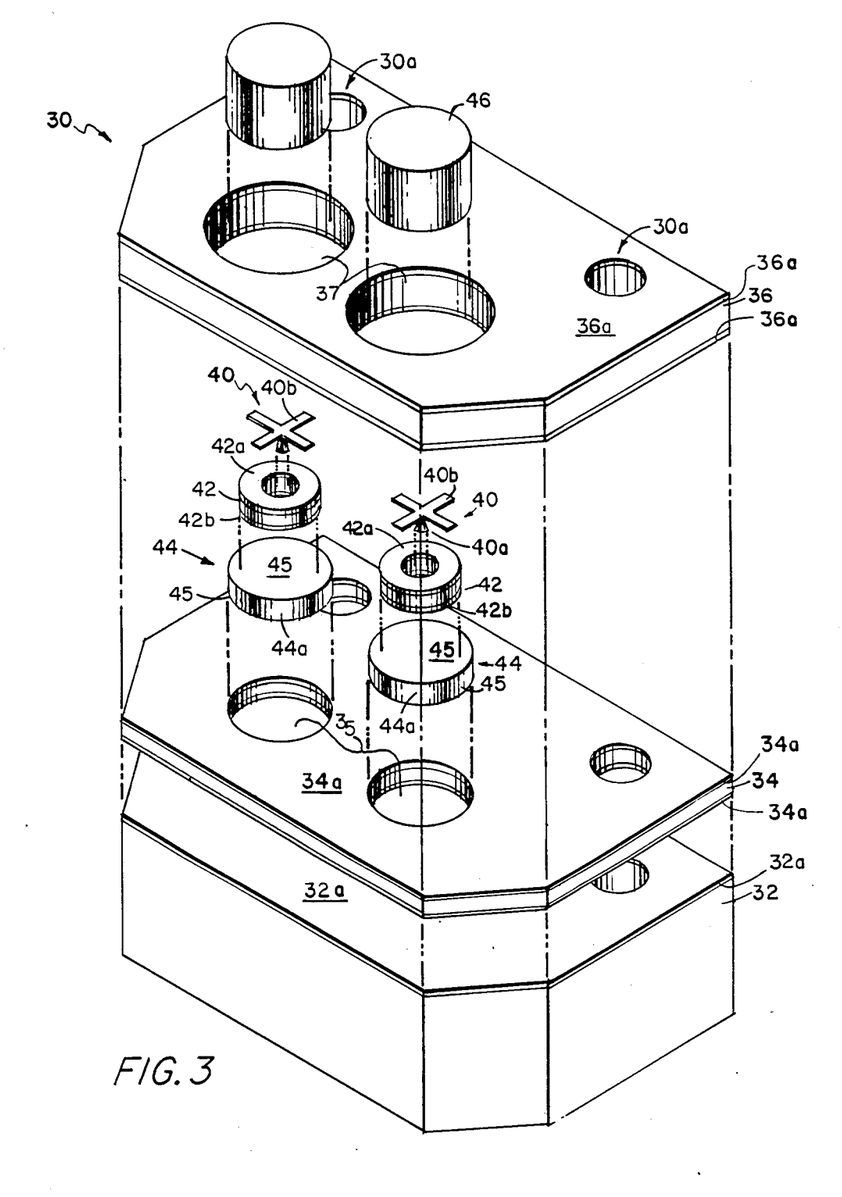
Figure 4:
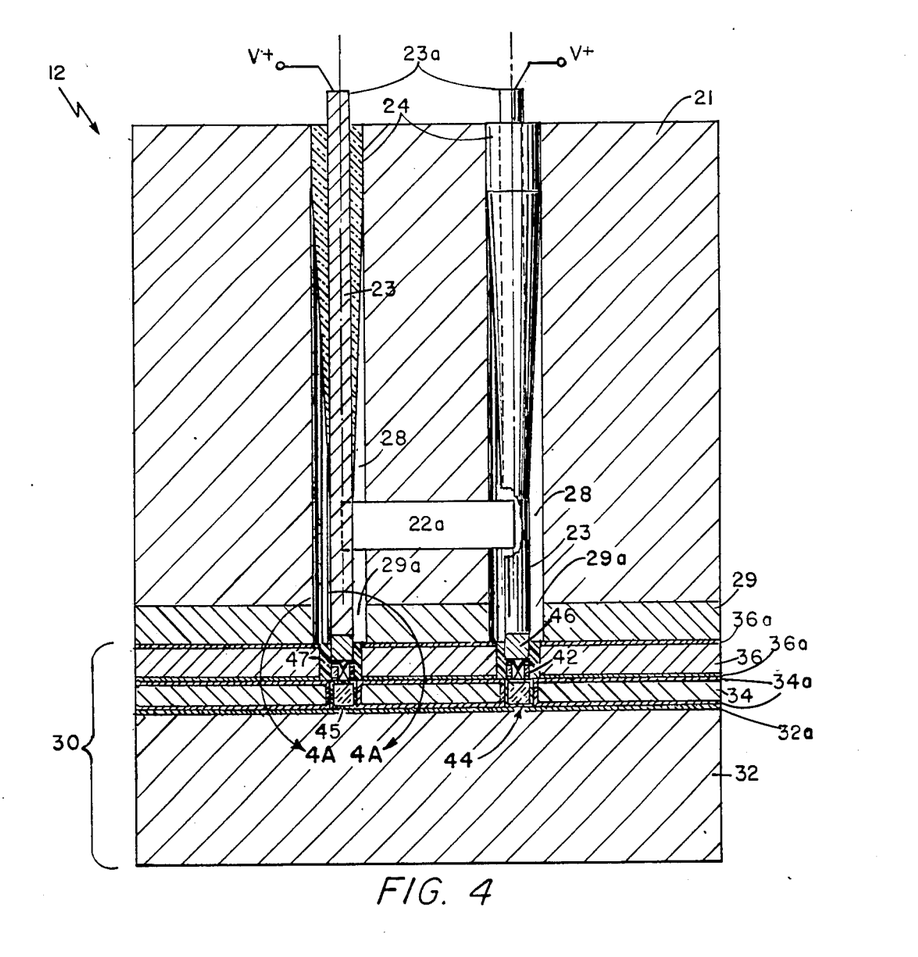
FIG. 4 is a cross-sectional view of the power combiner of FIG. 2 and diode module of FIG. 3 taken along lines 4—4 of FIG. 2.
Figure 4A:
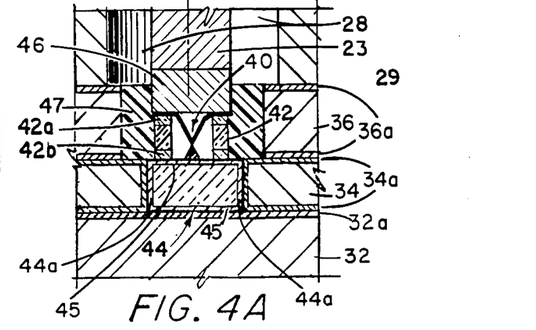
FIG. 4A is an enlarged cross-sectional view of a portion of FIG. 4.

Referring now to FIG. 2 and FIGS. 4, 4A, the power combiner 12 is shown to include a housing 21 having provided laterally therethrough a slot 22 having a rectangular cross-section. A first open end 22'40 of the rectangular slot 22 is terminated by a shorting plate provided by a rectangular shaped conductive block 25 inserted into such first end 22' and a second open end 22" of the rectangular slot 22 is formed within a mounting flange 27 portion of the housing 21 to provide the input/output port 12a (FIG. 1). Intermediate flange 27 and shorting plate 25 is a conductive plate 26 having an aperture 26a therethrough, commonly referred to as a coupling iris. The portion of the slot 22 disposed between shorting plate block 25 and apertured plate 26 provides a conventional resonant cavity 22a. The mounting flange 27 provides a connection to the waveguide 15 (FIG. 1) and hence to circulator 13 (FIG. 1). The power combiner circuit 12 further includes here a pair of center conductors 23 disposed through, and spaced from, passageways 28 provided in the housing 21, as shown. A pair of tapered loads 24 is disposed around the upper portions of the center conductors 23, as shown more clearly in FIG. 4. The dielectrically spaced center conductor 23 and the housing provide a coaxial transmission line, with the tapered load 24 being used to terminate the coaxial transmission line in the proper impedance. The center conductors 23 are spaced a predetermined distance L, here from the shorting plate 25 and from the apertured plate 26 approximately equal to (λ g/4) where λ g is the nominal wavelength of the signal in the cavity 22. An upper first end portion 23a of each center conductor 23 is adapted for electrical connection to a suitable bias source V+, and an opposing second end 23b of each center conductor 23 is adaptable for connection to diode 46, such diode 46 being disposed in diode module 30. Fabrication of diode module 30 will be discussed in further detail in conjunction with FIGS. 3 and 4. Suffice it to say here, however, that the diode module 30 and a spacer member 29 having a pair of apertures 29a, 29b each with a diameter equal to the diameter of passageway 28 are connected to housing 21 by inserting screws (not shown) through mounting holes 29b in spacer 29, and mounting holes 30a formed through said module 30 comprising a base 32, a heat sink holder 34 and an encapsulating material holder 36.

In operation, the frequency of the input signal source is selected to be near the resonant frequency of the cavity 22a, as is known in the art, and the input signal is introduced into the cavity 22a through the input/output port 12a (FIG. 1). A continuous bias signal V+, for example, is then applied to each center conductor 23, and in response to said bias signal and input signal, a continuous wave r.f. signal is provided from each one of said diodes disposed within diode module 30 (FIGS. 3, 4, 4A). The signals from each of such diodes are coupled from the coaxial transmission lines and combined together in resonant cavity 22a. It is to be noted that in response to the input signal and the continuous bias signal, the RF power from the IMPATT diodes coupled to the cavity 22a is locked to the frequency determined by the input signal. Each of such signals from each one of such diode oscillators is thus forced to resonate in-phase with each other at the frequency determined by the input signal. The power from each one of the diode oscillators is thus combined in the cavity 22a to provide a composite signal which is then coupled from the cavity 22a to the load 14.

Referring now to FIG. 3, the diode module 30 is shown to include a base 32, here stamped to the precise dimensions required from a sheet (not shown) of high thermally and electrically conductive copper which is then suitably annealed. Over surfaces of the base 32 is deposited a highly conductive composite metal layer 32a comprising a diffusion blocking layer of nickel 50-150 microinches thick and a plated layer of gold, generally plated to a thickness of 100-300 microinches to provide a suitable surface for bonding to the base 32 by either soldering or thermal compression bonding. The module 30 is shown to further include a heat sink holder member 34 having a pair of open-ended compartments, preferably apertures 35 which pass entirely through the heat sink holder member 24. The heat sink holder member 34 is here also stamped from a high conductivity copper sheet (not shown), and apertures 35 are provided in the member 34 to the predetermined dimensions required. Surfaces of the heat sink holder member 34 are also provided with a composite metal layer 34a of the aforementioned nickel and gold. Here a pair of diamond heat sinks 44 are then disposed within the apertures 35 provided in the heat sink holder member 34. Prior to insertion, however, the surfaces of sidewall portions 44a in contact with heat sink holder member 34 are provided with a composite metal layer 45 comprising consecutively deposited layers of titanium 100 nanometers thick, platinum 200 nanometers thick and gold 800 nanometers thick. Upper and lower surfaces are preferably provided with such layer 45 after insertion of the diamond heat sinks 44 in the apertures 35 of heat sink holder 34. The size of the apertures 35 is selected to be substantially equal to the size of the gold plated diamond members 44. The diamond members 44 are inserted into the apertures 35 such that the diamonds are substantially flush with and parallel to the upper and lower surfaces of the heat sink holder 34. Further, the heat sink holder member 34 is dimensioned to have a thickness substantially equal to the thickness of the diamond member 44. With the heat sink holder 34 having a thickness substantially equal to the thickness of the plated diamond 44, and a pair of apertures 35 being substantially equal to the size of the heat sinks 44, this arrangement permits the diamonds 44 to be pressed or inserted into the said holder 34 with their surfaces substantially flush and parallel with the surfaces of the holder 34, and thus substantially eliminating the tilting which generally occurs with prior techniques. It is important for optimum performance that the diamond heat sink 44 be so fitted within the aperture 35 provided in the heat sink holder member 34. If the entire diamond heat sink was not previously provided with the composite layer 45, the upper and lower surfaces of the diamond heat sink are then provided with such composite layer 45. The diamond containing heat sink holder member 34 is then thermal-compression bonded to the base 32. Generally, a force of about ten thousand pounds per square inch for a few minutes at an elevated temperature of 450° C. provides a sufficient bond between said members. A dielectric barrel 42, having an upper conductive surface 42a and a lower conductive surface 42b, is then bonded to the center of each diamond member 44 on lower conductive surface 42b. The alignment and placement of the dielectric barrel 42 substantially in the center of the diamond heat sink 44 is critical, therefore, the alignment and bonding apparatus used with the diamond heat sink 44 should be designed to maintain the same alignment while bonding each dielectric barrel 42 to the corresponding diamond heat sink 44.

IMPATT diode chips 40, having a mesa structure and selected and suitable electrical characteristics, are inserted into the dielectric barrels 42, and a base portion 40a which forms the lower electrical contact for the IMPATT 40 is then thermo-compression bonded to the composite metal surface 45 of diamond member 44. Here a beam lead pattern 40b which provides the upper electrode is thermo-compression bonded to the upper conductive portion 42a of the ceramic barrel 42. Generally, it has been found that IMPATT diode chips having one or two micron thick gold plated bottom contacts are suitably bonded to the diamond heat sink by applying a force equivalent to ten thousand pounds per square inch to the top of the mesa for 30-60 seconds at an elevated temperature of approximately 300° C. At this point, electrical testing may be provided to insure that the devices are still functional prior to fabrication of the remaining parts of the module. After completion of testing, an encapsulation holder member 36, having a pair of apertures 37 and a composite conductive layer 36a, as described above, is then bonded to the heat sink holder member 34, such that each aperture 37 in encapsulation holder 36 is substantially aligned with the corresponding aperture 35 previously provided in heat sink holder member 34. The module 30 is then baked at an elevated temperature of approximately 225° C. in a vacuum for a number of hours prior to sealing each diode with an encapsulating material. The module 30 is sealed generally in a dry protective atmosphere without exposing the diodes 40 to humidity or air between the vacuum bake and the sealing. Bias pin members 46 are then inserted through apertures 37 and bonded to the upper beam lead portions 40b of the diode 40. Sealing is accomplished by filling a region around each pin 46 and IMPATT 40 with a suitable encapsulating material 47 (FIG. 4A). The encapsulating material is introduced into the region by any suitable means, such as a syringe. The encapsulating material preferably is a conforming material which will take on the shape of the region around IMPATT diode 40 and pin 46 and thus completely fill the region. The selected material should be material with a relatively low dielectric constant, less than 5, and is typically between two and five, and when cured it should possess good dielectric properties including a high breakdown strength and a low loss tangent at the operating frequency. One such material selected for use at 44 GHz is polyimide. Air could also be used, however, the mechanical integrity associated with using a material such as polyimide would not be present. The polyimide encapsulating material is preferably cured at a temperature in excess of 400° C. The apertures 37 provided in encapsulating material holder 36 have a selected diameter which is smaller than the diameter of the apertures 29a provided in spacer member 29, and the diameter of the passageways 28 provided in housing 21. The selectively smaller diameter of apertures 37 in combination with the encapsulating material provides a requisite impedance transformation between the IMPATT diode and the coaxial transmission line.

With such an arrangement, a diode module assembly comprising two sealed diode elements is provided. Since the diode assembly is sealed and also has substantially higher mechanical integrity, the assembly will not require the critical handling generally associated with individually sealed diodes mounted in conventional coaxial oscillator circuits.

Having described a preferred embodiment of the invention, it will now be apparent to one of skill in the art that other embodiments such as a single diode module incorporating its concept may be used. It is felt, therefore, that this invention should not be restricted to the disclosed embodiment, but rather should be limited only by the spirit and scope of the appended claims.

What is claimed is:

1. A diode module comprising:
   means for providing an electrically and thermally conductive support;
   a dielectric spacer having an aperture and a pair of opposing conductive surfaces with a first surface being in electrical contact with said support means;
   a diode disposed through the aperture in said spacer having a first end disposed on the electrically and thermally conductive support;
   a first member, having an aperture of a predetermined size, disposed over the support means, with the dielectric spacer member and diode being disposed within the aperture provided in said first member;
   a second member disposed through the aperture in said first member and electrically coupled to a second end of the diode; and
   a dielectric encapsulating material disposed in the aperture provided in the first member.

2. The module as recited in claim 1 wherein the predetermined size of the aperture in the first member and a dielectric constant of the dielectric encapsulating material is selected to provide the diode with a predetermined impedance characteristic.

3. The module of claim 2 wherein said dielectric encapsulating material is a conformable material which retains the shape of the aperture when cured.

4. The module of claim 3 wherein said conformable material is polyimide.

5. The module of claim 4 wherein the first surface of said dielectric spacer is bonded to said support means, the diode is disposed through the center of the aperture of the dielectric spacer and is bonded to the conductive support, said first member is bonded to the conductive support and is comprised of a thermally and electrically conductive material, and said second member is bonded to a second electrode of the diode and second conductive surface of the dielectric spacer and is comprised of a thermally and electrically conductive material.

6. A module comprising:
   a heat sink holder member, having first and second opposing surfaces and a plurality of apertures provided completely through said holder member terminating at said first and second opposing surfaces;
   a plurality of heat sink members, each one having first and second surfaces and being disposed in a corresponding one of such apertures such that said first and second surfaces of the heat sink members are substantially flush with the corresponding first and second surfaces of the heat sink holder member;
   a plurality of dielectric spacer members, each spacer member having an aperture and each being disposed in thermal and electrical contact on a corresponding one of such heat sink member; and
   a plurality of negative resistance diodes, each one being disposed through the aperture of a corresponding one of such dielectric spacer members and in electrical and thermal contact with said corresponding heat sink member.

7. The module as recited in claim 6 wherein the heat sink members comprises diamond slabs.

8. The module of claim 7 further comprising:
   a base member bonded to the heat sink holder member over a surface of said heat sink holder member opposite to a surface over which the diodes are provided in electrical and thermal contact with the heat sink member.

9. The module of claim 8 wherein said base member and heat sink holder member are each comprised of a thermally and electrically conductive material.

10. A diode module comprising:
    a base member;
    a heat sink holder member, having an aperture, disposed on the base member;
    a diamond heat sink having a conductive layer disposed thereon, said diamond heat sink being disposed in the aperture provided in the heat sink member;
    a dielectric annular spacer having upper and lower conductively plated surfaces with the lower plated surface being disposed on said conductive layer of said diamond heat sink;

a negative resistance diode, having a pair of electrical contacts, connected between the conductive layer on the diamond heat sink and the upper surface of the dielectric annular spacer;

an encapsulation holder member, having an aperture, disposed on the heat sink holder member, said aperture being aligned with the diode;

a bias pin disposed over said diode and in electrical contact with the upper conductive surface of the dielectric annular spacer; and a dielectric encapsulation material disposed in the aperture in said encapsulation holder.

11. The module of claim 10 wherein the heat sink holder member is bonded to the base member, the encapsulation holder member is bonded to the heat sink holder member and the bias pin is bonded to the upper conductive surface of the dielectric spacer.

12. A power combiner for combining a pair of radio frequency signals into a composite signal comprising:

a conductive body member having a rectangular cavity, said cavity being terminated at a first end by a short-circuited member and at a second, opposing end by a coupling member, said body member further having a pair of opposing passageways provided through said body member and through a pair of parallel sidewall portions of said cavity;

a pair of conductors, each one provided through a corresponding one of said passageways, said conductors being dielectrically spaced from the body member and having a first end adaptable for connection to a bias source;

means coupled to the second end portions of the pair of conductors for providing the pair of radio frequency signals to the pair of conductors in response to bias signals fed by the conductors;

means for coupling said radio frequency signals from said conductors into said rectangular cavity to provide the composite radio frequency signal;

wherein said radio frequency signal means comprises:

a heat sink holder member, having first and second opposing surfaces and a pair of apertures provided completely through said holder member terminating at said first and second opposing surfaces;

a pair of heat sink members, each one having first and second opposing surfaces and being disposed in a corresponding one of said apertures provided in the heat sink holder member such that said first and second surfaces of the heat sink members are substantially flush with the corresponding first and second surfaces of the heat sink holder member;

a pair of dielectric spacer members, each one having an aperture, and each one being disposed on a corresponding one of such heat sink holder members;

a pair of negative resistance diodes, each one disposed through the aperture of a corresponding one of said spacer members, each diode having a pair of electrodes with the first electrode of each diode disposed on a corresponding one of said heat sinks; and means for coupling each one of the conductors to a second electrode of a corresponding one of said negative resistance diodes.

13. A power combiner as recited in claim 12 wherein the coupling means further comprises:

a member, having a pair of apertures, disposed on the heat sink holder member with each one of said apertures having disposed therethrough a corresponding one of the negative resistance diodes disposed within corresponding dielectric spacer members; and a pair of pin members, each one being disposed betwee the second electrode of a corresponding one of such negative resistance diodes and a corresponding one of such conductors.

14. The power combiner as recited in claim 13 further comprising a dielectric encapsulating material disposed in the aperture provided in said member.

15. In combination:

a resonant cavity; and means coupled to the cavity for providing at least one radio frequency signal to the cavity, said means including:

(i) means for providing an electrically and thermally conductive support;

(ii) a dielectric spacer having an aperture and a pair of opposing conductive surfaces, with a first surface being in electrical contact with said support means;

(iii) a diode disposed through the aperture in said spacer and having a first end disposed on the electrically and thermally conductive support;

(iv) a first member, having an aperture, disposed over the support means, with the dielectric spacer member and diode being disposed within the aperture;

(v) a second member disposed over a second end of the diode; and (vi) a dielectric encapsulating material disposed in the aperture provided in the first member.

16. A power combiner for combining a pair of radio frequency signals into a composite signal comprising:

means for providing a resonant cavity;

means coupled to the resonant cavity means for providing a pair of radio frequency signals to the resonant cavity means, comprising:

a base member;

a heat sink holder member, having a pair of apertures, disposed on the base member;

a pair of diamond heat sinks, each having a conductive layer disposed on an outer surface of the diamond heat sink with each diamond heat sink being disposed in a corresponding one of the apertures provided in the heat sink holder member;

a pair of dielectric annular spacers, each having upper and lower conductive surfaces with the lower conductive surface of each corresponding spacer being disposed on the conductive layer disposed on the outer surface of a corresponding one of said diamond heat sinks;

a pair of negative resistance diodes, each connected between the conductive surface on the corresponding diamond heat sink and the upper conductive surface of the dielectric annular spacer;

an encapsulation holder member, having a pair of apertures, disposed on the heat sink holder member, each diode and dielectric spacer being disposed within a corresponding aperture provided in the encapsulation holder member;

a pair of bias pins, each one disposed over a corresponding one of said diodes and in electrical contact with the upper conductive surface of the dielectric spacer; and a dielectric encapsulation material disposed in each one of the apertures in said encapsulation holder.

17. The power combiner of claim 16 wherein said cavity means comprises:

a conductive body member having a rectangular cavity, said cavity being terminated at a first end by a short-circuited member and a second, opposing end by a coupling member, said body member further having a pair of parallel passageways provided through said body member and through a pair of opposing sidewall portions of said cavity; and a pair of conductors, each one provided through a corresponding one of said passageways, said conductors being dielectrically spaced from the body member and having a first end adaptable for connection to a bias source and a second end connected to a corresponding one of said bias pins.

* * * * *

UNITED STATES PATENT AND TRADEMARK OFFICE
CERTIFICATE OF CORRECTION

PATENT NO. : 4,689,583

DATED : August 25, 1987

INVENTOR(S) : George Jerinic, James R. Fines

It is certified that error appears in the above-identified patent and that said Letters Patent is hereby corrected as shown below:

Column 4, line 48, delete "22'40" and replace with --22'--.

Signed and Sealed this

Thirteenth Day of September, 1988

Attest:

DONALD J. QUIGG

Attesting Officer

Commissioner of Patents and Trademarks